United States Patent [19]

Ueno et al.

[11] Patent Number: 5,004,988
[45] Date of Patent: Apr. 2, 1991

[54] QUARTZ CRYSTAL OSCILLATOR WITH TEMPERATURE-COMPENSATED FREQUENCY CHARACTERISTICS

[75] Inventors: Yoshifusa Ueno; Takihei Tanzawa; Takayuki Suzuki, all of Tokorozawa, Japan

[73] Assignee: Nihon Dempa Kogyo Co., Ltd., Tokyo, Japan

[21] Appl. No.: 382,107

[22] Filed: Jul. 19, 1989

[30] Foreign Application Priority Data

Jul. 25, 1988 [JP] Japan .................. 63-186276
Sep. 30, 1988 [JP] Japan .................. 63-248632
Dec. 31, 1988 [JP] Japan .................. 63-335049

[51] Int. Cl.$^5$ .............................................. H03B 5/04
[52] U.S. Cl. ................................ 331/116 R; 331/158; 331/176
[58] Field of Search ............ 331/116 R, 116 FE, 158, 331/176

[56] References Cited

U.S. PATENT DOCUMENTS 3,792,377 2/1974 Fujita .
4,051,446 9/1977 Owaki ........................ 331/176 X
4,456,892 6/1984 Vandergraaf .

FOREIGN PATENT DOCUMENTS 2936378 3/1981 Fed. Rep. of Germany .
60-165804 8/1985 Japan .
2147167A 5/1985 United Kingdom .

Primary Examiner—Robert J. Pascal
Attorney, Agent, or Firm—Frishauf, Holtz, Goodman & Woodward

[57] ABSTRACT

A temperature-compensated quartz crystal oscillator has two or more temperature compensating units. The first temperature compensating unit compensates the frequency-temperature characteristics of the oscillator over its rated temperature range. The other temperature compensating units further independently compensate the frequency-temperature characteristics of the oscillator within respective specific temperature regions of the compensated frequency-temperature characteristics to obtain desired frequency-temperature characteristics for the crystal oscillator.

12 Claims, 13 Drawing Sheets

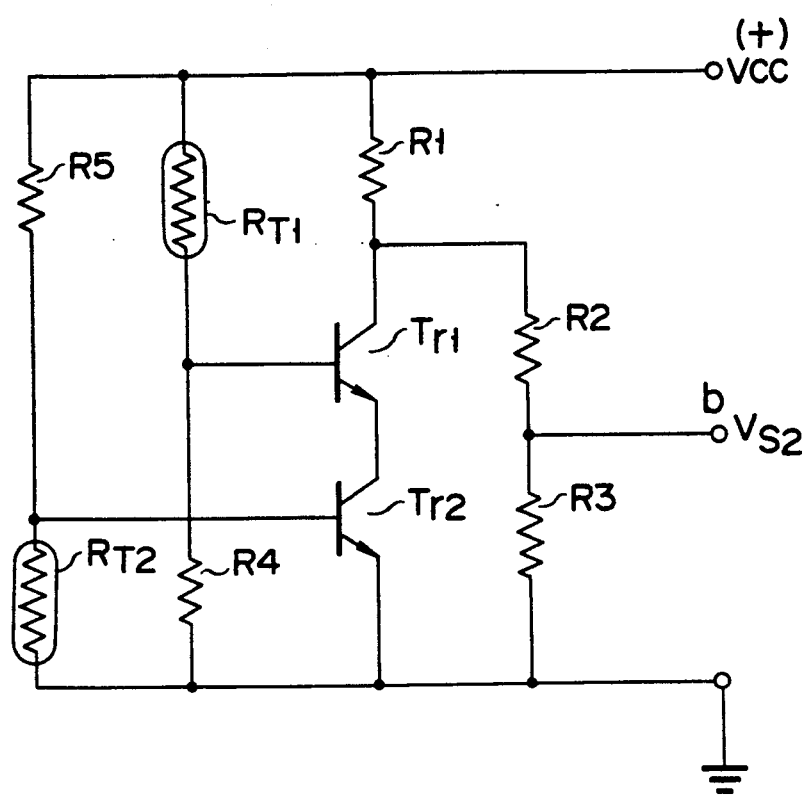
F I G. 5
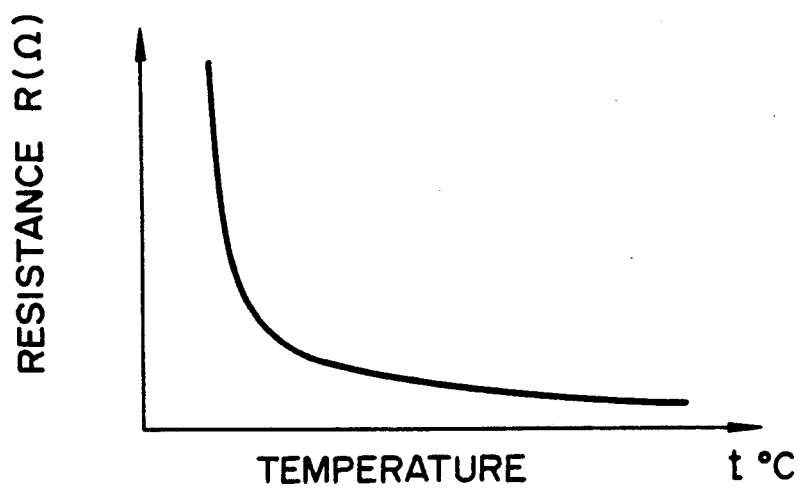
F I G. 6

F I G. 14
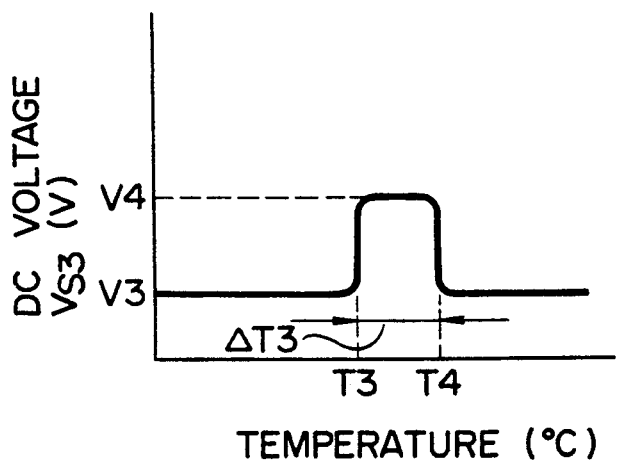
F I G. 15
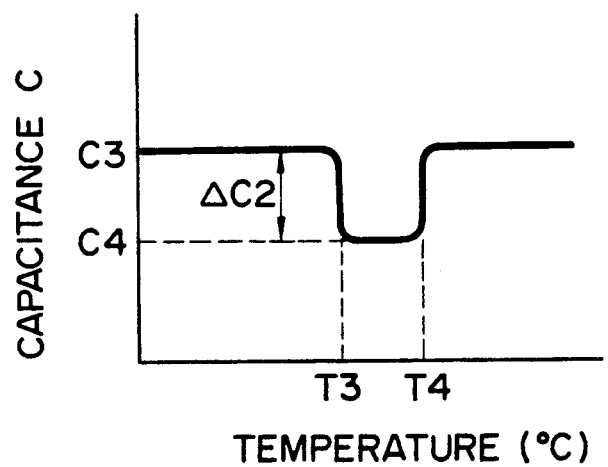
F I G. 16
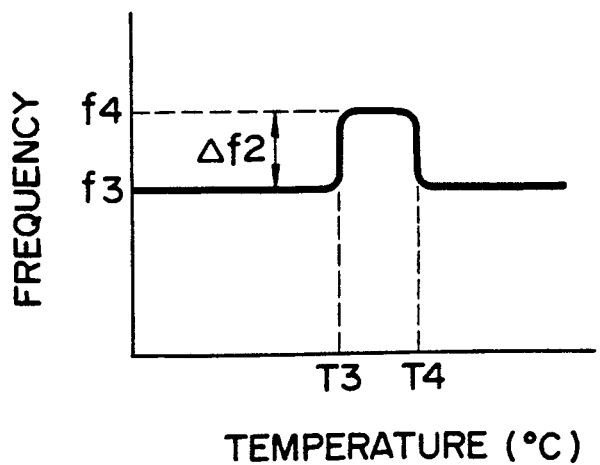

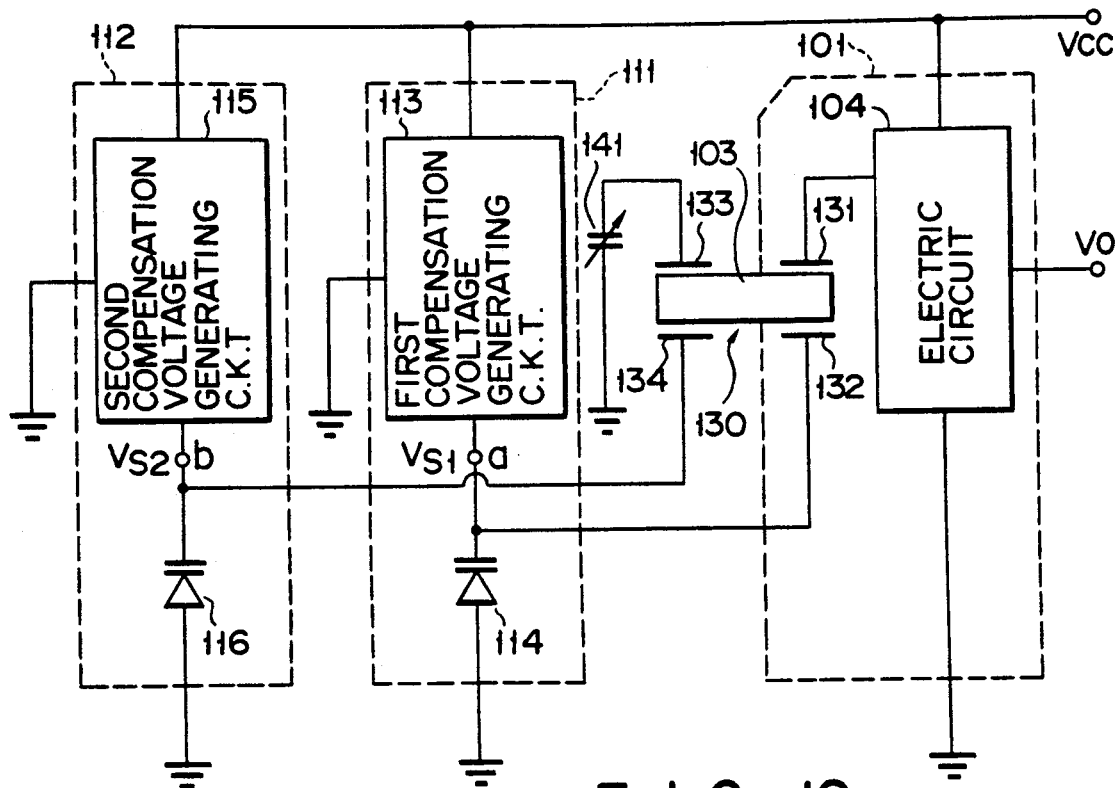
F I G. 18
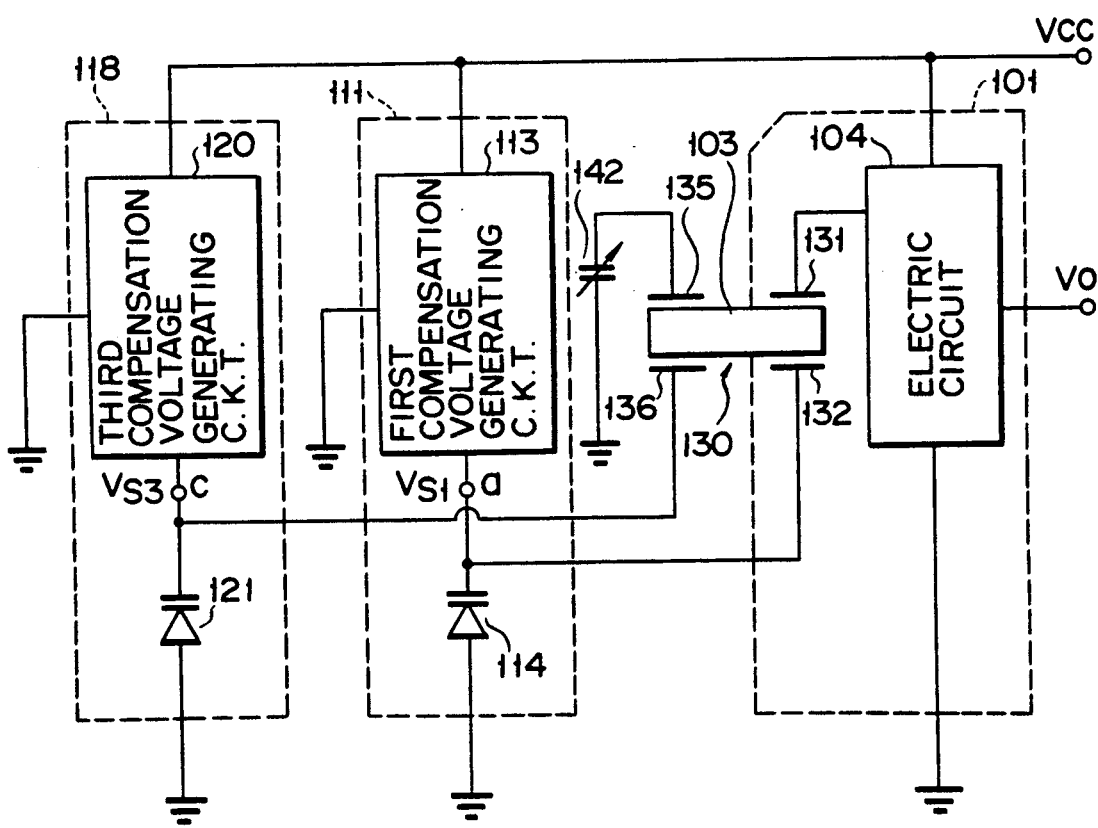
F I G. 19

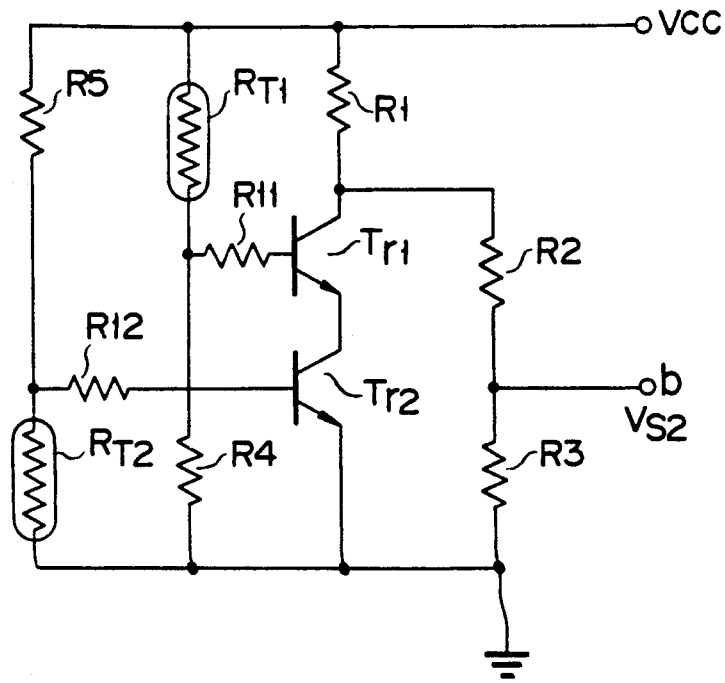
F I G. 21
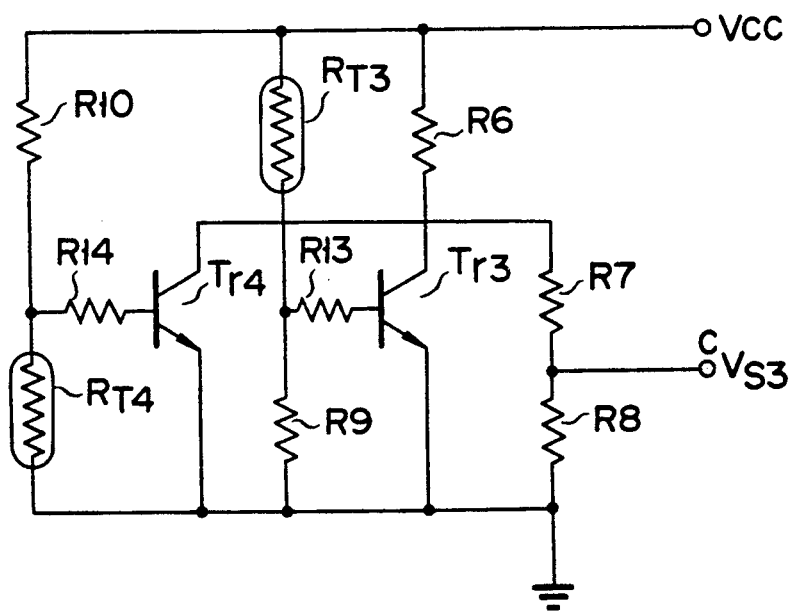
F I G. 25

F I G. 22
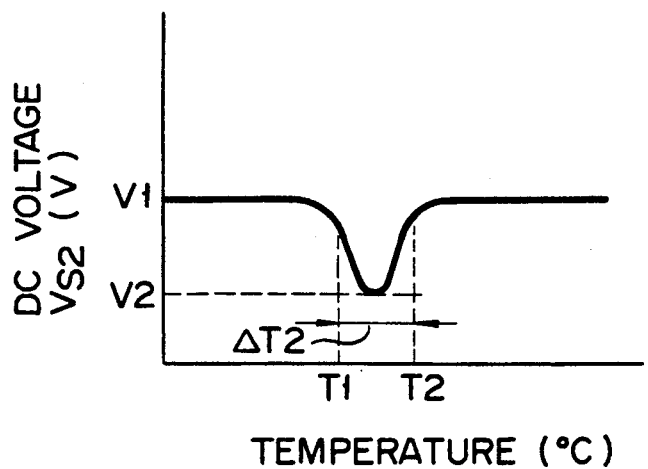
F I G. 23
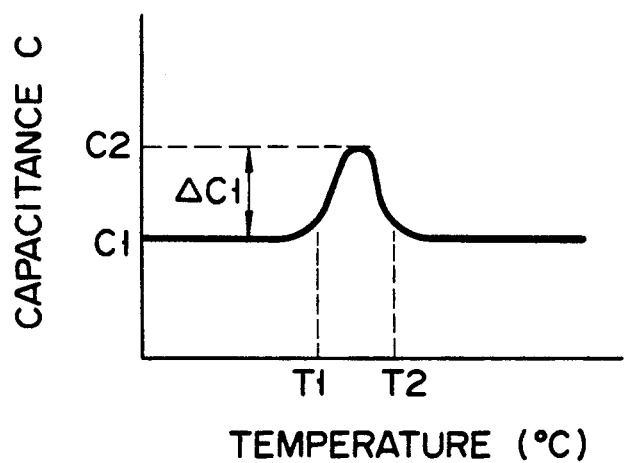
F I G 24
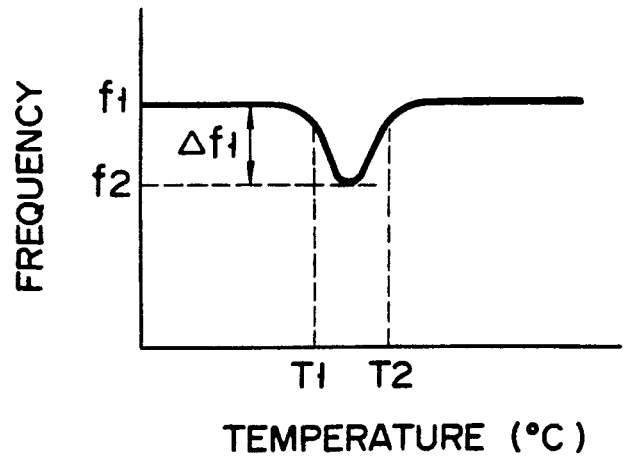

QUARTZ CRYSTAL OSCILLATOR WITH TEMPERATURE-COMPENSATED FREQUENCY CHARACTERISTICS

BACKGROUND OF THE INVENTION

1. Title of the Invention

The present invention relates to a quartz crystal oscillator and, more particularly, to a quartz crystal oscillator whose frequency characteristics are temperature-compensated (to be referred to as a temperature-compensated quartz crystal oscillator hereinafter).

2. Description of the Related Art

A temperature-compensated quartz crystal oscillator which is compensated for a change in frequency of a quartz crystal vibrator based on a change in temperature has been widely used. In recent years, since communication requirements have become stricter year by year, a temperature-compensated quartz crystal oscillator having further stabilized frequency characteristics with respect to a change in temperature has been demanded.

FIG. 1 is a block diagram of a conventional temperature-compensated quartz crystal oscillator.

The temperature-compensated quartz crystal oscillator includes an oscillating circuit 1 and a temperature compensator 2. The oscillating circuit 1 includes a quartz crystal vibrator 3 serving as an oscillating element, and an electric circuit 4 coupled to the quartz crystal vibrator 3. The first electrode of the quartz crystal vibrator 3 is connected to the base of an oscillating transistor in the electric circuit 4. The quartz crystal vibrator 3 and the oscillating transistor together with other circuit elements such as a capacitor (not shown) constituting the electric circuit 4 provide, e.g., a Colpitts-type oscillating circuit. The quartz crystal vibrator 3 is of, e.g., an AT cut type, and vibrates in the thickness shear mode. Reference symbol $V_{CC}$ denotes a power source; and $V_O$, an output terminal.

When the second electrode of the quartz crystal vibrator 3 is connected to a ground potential, the oscillating circuit 1 exhibits frequency-temperature characteristics represented by a curve $\alpha$ in FIG. 2. The frequency-temperature characteristic curve is a cubic curve having an inflection point near normal temperature, i.e., 25° C. Such a cubic curve is mainly obtained by the characteristics of the quartz crystal vibrator 3.

The temperature compensator 2 includes a compensation voltage generating circuit 6 for generating a compensation voltage and a capacitor element 7 whose capacitance is variable in accordance with a voltage. The compensation voltage generating circuit 6 constitutes a serial/parallel network including a temperature transducer (e.g., a thermistor) and a resistor which are connected between the power source $V_{CC}$ and the ground potential. The compensation voltage generating circuit 6 generates a compensation voltage Vs1 corresponding to ambient temperature at an output terminal a in accordance with a resistance of the thermistor. The compensation voltage Vs1 serves to cause the oscillating circuit 1 to generate the frequency-temperature characteristics represented by a curve $\beta$ in FIG. 2. The frequency-temperature characteristic curve $\beta$ in FIG. 2 is a cubic curve obtained by substantially inverting the cubic curve of the frequency-temperature characteristics of the oscillating circuit 1. The capacitor element 7 is, e.g., a varactor. The cathode of the capacitor element 7 is connected to the output terminal a of the compensation voltage generating circuit 6, and the anode of the capacitor element 7 is grounded. A node between the compensation voltage generating circuit 6 and the varactor 7 is connected to the second electrode of the quartz crystal vibrator 3.

In the circuit with the above arrangement, a capacitance of the varactor 7 is changed on the basis of the compensation voltage Vs1 corresponding to ambient temperature. When the capacitance is changed, the frequency-temperature characteristics of the oscillating circuit 1 are compensated, and the compensated frequency-temperature characteristics represented by a curve $\gamma$ in FIG. 2 can be obtained. The frequency-temperature characteristics satisfy prescribed ratings.

In the temperature-compensated quartz crystal oscillator with the above arrangement, however, the theoretically inevitable problems are posed as follows. These problems will be described hereinafter with reference to FIG. 3.

FIG. 3 is an enlarged view of the curve $\gamma$ in FIG. 2. As is apparent from a curve $\delta$ obtained by connecting circles in FIG. 3, if ratings are set such that an allowable frequency deviation $\Delta f/f$ falls within the range of $\pm 2$ ppm in a temperature range $\Delta T1$ defined by temperatures of $-30°$ C. to $70°$ C., the compensated frequency-temperature characteristics satisfy the above ratings. However, if the ratings are set such that an allowable frequency deviation $\Delta f/f$ falls within the range of $\pm 1$ ppm in the temperature range $\Delta T1$, the ratings are not satisfied in temperature ranges near $-20°$ C. and $60°$ C. respectively surrounded by dotted lines.

When the ratings are not satisfied as described above, conventionally, a resistance in the compensation voltage generating circuit 6 is corrected by calculation on the basis of the obtained frequency-temperature characteristics. Thus, another compensation voltage generating circuit 6 is manufactured and it is used to replace the old compensation voltage generating circuit 6 to obtain an allowable deviation of $\pm 1$ ppm.

Even if a resistor has excellent characteristics, its resistance generally has an error of 1 to 2%. The thermistor has a standard resistance error and the B constant of the thermistor also changes in accordance with temperature. Therefore, even if the resistance in the compensation voltage generating circuit 6 is corrected, an error of about $\pm 0.5$ ppm is generated with respect to the characteristics obtained by theoretical calculation.

In consideration of the above situation, even if another compensation voltage generating circuit 6 is manufactured in the conventional temperature-compensated quartz crystal oscillator, it is practically difficult to obtain an allowable deviation of $\pm 1$ ppm or less because of the problems of the precision of each element. When the deviation $\Delta f/f$ falls within a range of $\pm 1$ ppm or less, the production yield of the temperature-compensated quartz crystal oscillator is degraded, thus degrading productivity.

SUMMARY OF THE INVENTION

It is an object of the present invention to provide a temperature-compensated quartz crystal oscillator having frequency-temperature characteristics which satisfy ratings.

In order to achieve the above object, there is provided a temperature-compensated quartz crystal oscillator for providing a signal oscillating at a predetermined frequency, said crystal oscillator having frequency-temperature characteristics depending upon temperature, the frequency of the signal provided by said oscillator being determined by said frequency-temperature characteristics, said oscillator comprising:

oscillating circuit means for providing an oscillating signal, said oscillating circuit means having a quartz crystal vibrator as an oscillating element, the oscillating circuit means having a rated temperature range and given frequency-temperature characteristics; and temperature compensating means, coupled to the quartz crystal vibrator, for compensating the frequency-temperature characteristics of the oscillating circuit means, the temperature compensating means including, first temperature compensating means for compensating the frequency-temperature characteristics of the oscillating circuit means within a rated temperature range of the oscillating circuit means to obtain compensated frequency-temperature characteristics, and second temperature compensating means for further compensating the compensated frequency-temperature characteristics in a specific temperature region of the compensated frequency-temperature characteristics, to obtain desired frequency-temperature characteristics for the crystal oscillator.

According to the temperature-compensated quartz crystal oscillator with the above arrangement, the characteristics of the a specific temperature region in frequency-temperature characteristics compensated by the first temperature compensating unit are further compensated by the second temperature compensating unit. Therefore, circuit elements in the first temperature compensating unit need not be replaced as in the conventional case. When the second temperature compensating unit according to the present invention is used, a frequency deviation can be selectively compensated.

BRIEF DESCRIPTION OF THE DRAWINGS

Other objects and advantages will be apparent from the following description when considered in conjunction with the accompanying drawings, in which:

FIG. 5 is a circuit diagram showing an arrangement of a second compensation voltage generating circuit;

FIG. 6 is a graph showing resistance-temperature characteristics of a thermistor used in the second compensation voltage generating circuit;

FIG. 14 is a graph showing temperature dependency of a third compensation voltage Vs3;

FIG. 15 is a graph showing capacitance-temperature characteristics of the varactor;

FIG. 16 is a graph showing a change in oscillation frequency of the oscillating circuit corresponding to a change in temperature;

FIG. 18 is a block diagram of a temperature-compensated quartz crystal oscillator according to a fourth embodiment of the present invention;

FIG. 19 is a block diagram of a temperature-compensated quartz crystal oscillator according to a fifth embodiment of the present invention;

FIG. 21 is a circuit diagram showing another arrangement of the second compensation voltage generating circuit;

FIG. 22 is a graph showing temperature dependency of a second compensation voltage Vs2 in FIG. 21;

FIG. 23 is a graph showing capacitance-temperature characteristics of a varactor in accordance with the second compensation voltage Vs2 in FIG. 21;

FIG. 24 is a graph showing a change in oscillation frequency of the oscillating circuit corresponding to a change in temperature in accordance with the second compensation voltage Vs2 in FIG. 21;

FIG. 25 is a circuit diagram showing another arrangement of the third compensation voltage generating circuit;

DETAILED DESCRIPTION OF THE PREFERRED EMBODIMENTS

Figure 4:
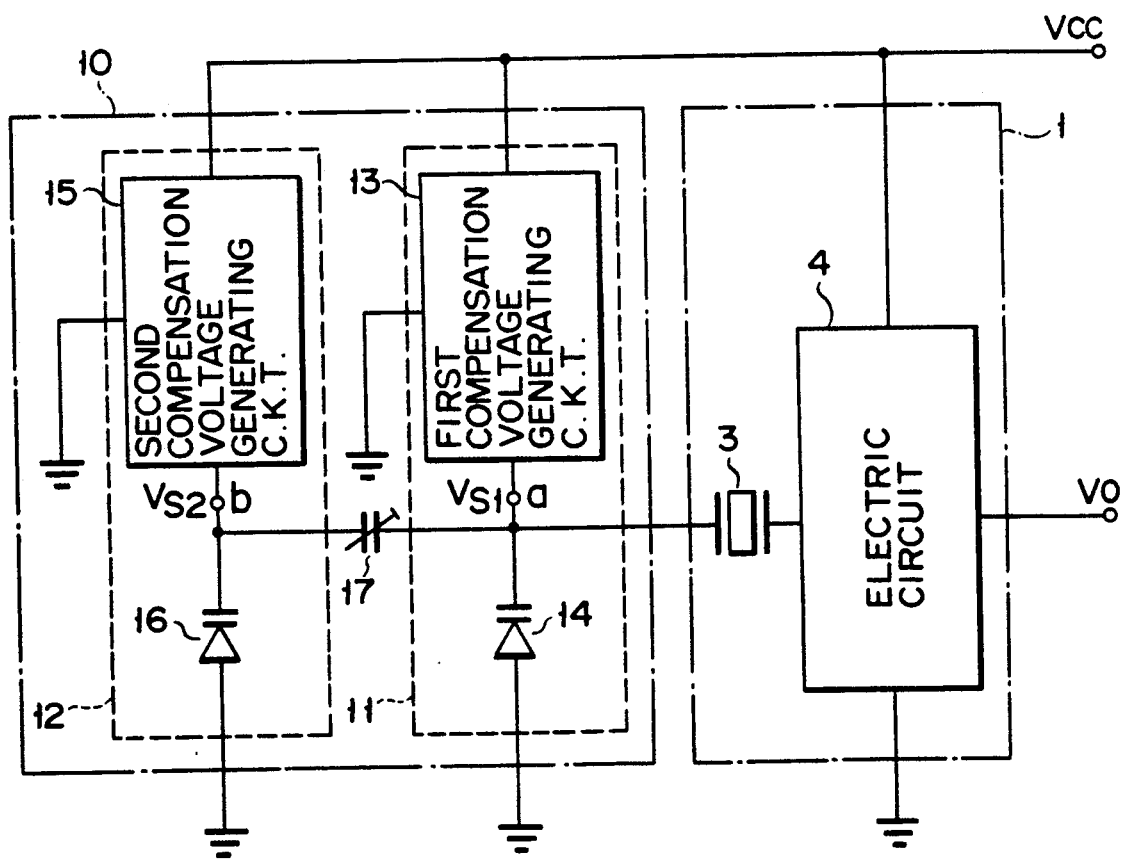
FIG. 4 is a block diagram of a temperature-compensated quartz crystal oscillator according to a first embodiment of the present invention.

A first embodiment of a temperature-compensated quartz crystal oscillator according to the present invention will be described hereinafter with reference to FIG. 4. In this embodiment, the oscillator further compensates temperature-compensated frequency-temperature characteristics having a specific temperature region in which frequency-temperature characteristics fall outside the desired frequency deviation limits for the rated range in the positive direction.

Figure 2:
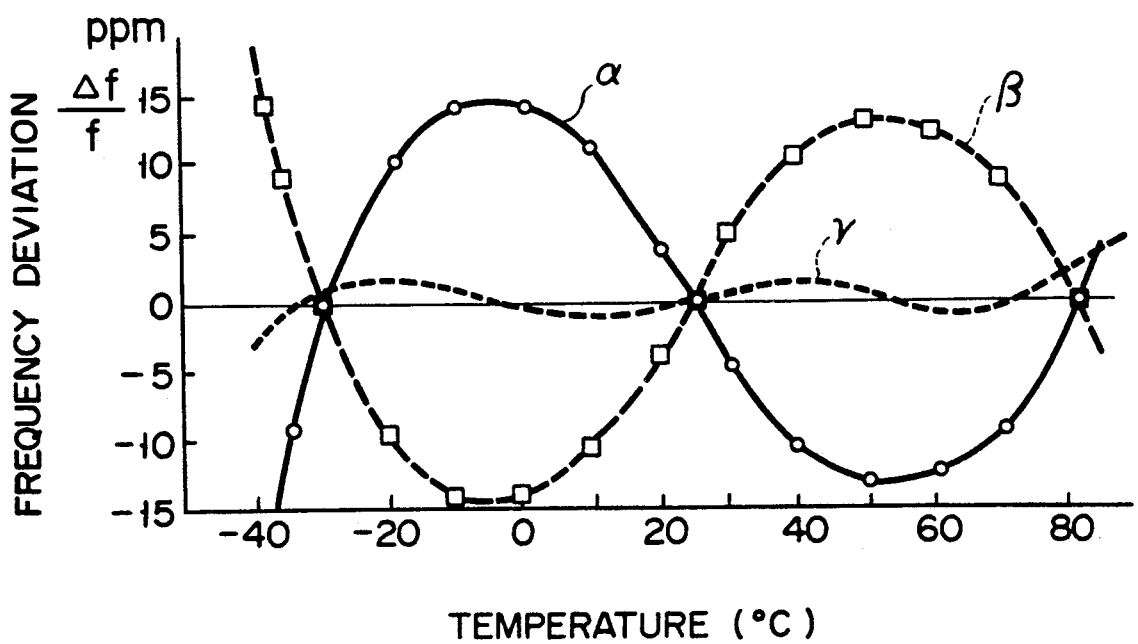
FIG. 2 is a graph, showing a change in frequency deviation in accordance with a change in temperature, of the conventional temperature-compensated quartz crystal oscillator.

The temperature-compensated quartz crystal oscillator includes an oscillating circuit 1 and a temperature compensator 10. The oscillating circuit 1 is connected to a power source $V_{CC}$, and has an output terminal $V_O$. The first electrode of an AT cut quartz crystal vibrator 3 is connected to the base of an oscillating transistor in an electric circuit 4. The oscillating circuit 1 is of a Colpitts type. The frequency-temperature characteristics of the oscillating circuit 1 are represented by a cubic curve α in FIG. 2. This cubic curve has an inflection point at normal temperature of 25° C.

Figure 1:
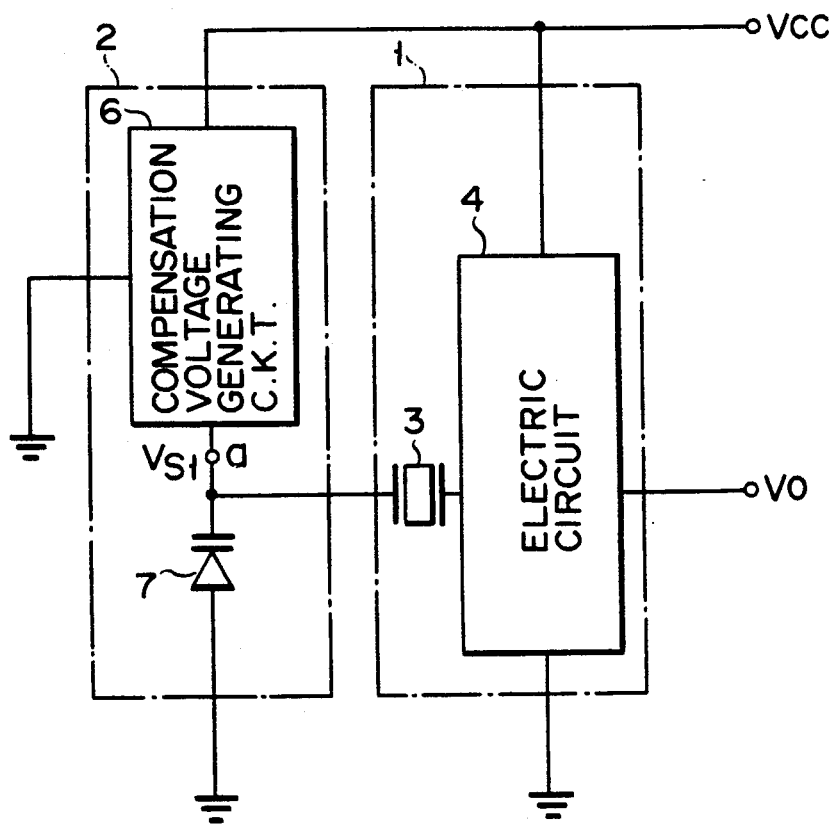
FIG. 1 is a block diagram showing a conventional temperature-compensated quartz crystal oscillator.

The temperature compensator 10 includes first and second temperature compensating units 11 and 12. The first temperature compensating unit 11 corresponds to the conventional temperature compensator 2 shown in FIG. 1, and includes a first compensation voltage generating circuit 13 and a first varactor 14. The first compensation voltage generating circuit 13 outputs a first compensation voltage Vs1 corresponding to ambient temperature in a rated temperature range at an output terminal a, and supplies it to the cathode of the first varactor 14. The cathode of the first varactor 14 is connected to the second electrode of the quartz crystal vibrator 3. One terminal of the first compensation voltage generating circuit 13 is connected to the power source $V_{CC}$, and the other terminal thereof is grounded. The anode of the first varactor 14 is grounded.

The second temperature compensating unit 12 includes a second compensation voltage generating circuit 15 and a second varactor 16.

One terminal of the second compensation voltage generating circuit 15 is connected to the power source $V_{CC}$, and the other terminal thereof is grounded. The second compensation voltage generating circuit 15 outputs a second compensation voltage Vs2 corresponding to a temperature in the rated temperature range at an output terminal b. As represented by temperature-voltage characteristics in FIG. 8, the second compensation voltage Vs2 is set to have a substantially constant value, i.e., V1 outside a specific temperature region ΔT2 in the rated temperature range. In the specific temperature region ΔT2, the second compensation voltage Vs2 is a specific compensation voltage V2 lower than the voltage V1.

The cathode of the second varactor 16 is connected to the output terminal b of the generating circuit 15, and the anode thereof is grounded.

A coupling capacitor 17 is arranged between the output terminal a of the first compensation voltage generating circuit 13 and the output terminal b of the second compensation voltage generating circuit 15.

FIG. 5 shows a detailed arrangement of the second compensation voltage generating circuit 15. A load resistor R1, a collector-emitter path of a transistor Tr1, and a collector-emitter path of a transistor Tr2 are connected in series with each other between the power source $V_{CC}$ and a ground potential. Series-connected resistors R2 and R3 are arranged between the collector of the transistor Tr1 and the emitter of the transistor Tr2. A node between the resistors R2 and R3 is connected to the output terminal b of the second compensation voltage generating circuit 15 for outputting the second compensation voltage Vs2. A thermistor RT1 and a resistor R4 are connected between the power source $V_{CC}$ and the ground potential, and a node between the thermistor RT1 and the resistor R4 is connected to the base of the transistor Tr1. In addition, a resistor R5 and a thermistor RT2 are connected between the power source $V_{CC}$ and the ground potential, and a node between the resistor R5 and the thermistor RT2 is connected to the base of the transistor Tr2.

Figure 7A:
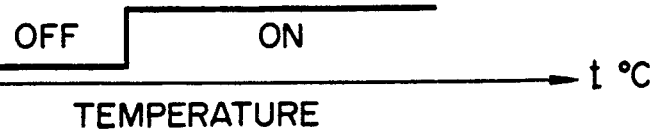
FIGS. 7A to 7C are graphs showing switching characteristics of transistors Tr1 and Tr2 which are shown in FIG. 5 and those of a transistor circuit constituted by the transistors Tr1 and Tr2.
Figure 7B:
Figure 7C:
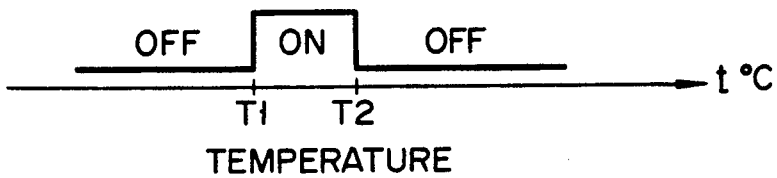

The thermistors RT1 and RT2 have resistance-temperature characteristics shown in FIG. 6. More specifically, the resistance of the thermistor is exponentially decreased along with an increase in temperature. As shown in FIG. 7A, the characteristics of the thermistor RT1 and the resistance of the resistor R4 are set to turn on the transistor Tr1 at a temperature T1. As shown in FIG. 7B, the characteristics of the thermistor RT2 and the resistance of the resistor R5 are set to turn off the transistor Tr2 at a temperature T2. Therefore, as shown in FIG. 7C, each of the transistors Tr1 and Tr2 performs a switching operation in which it is kept ON in a range defined by temperatures T1 to T2, and is kept OFF at other temperatures.

Figure 8:
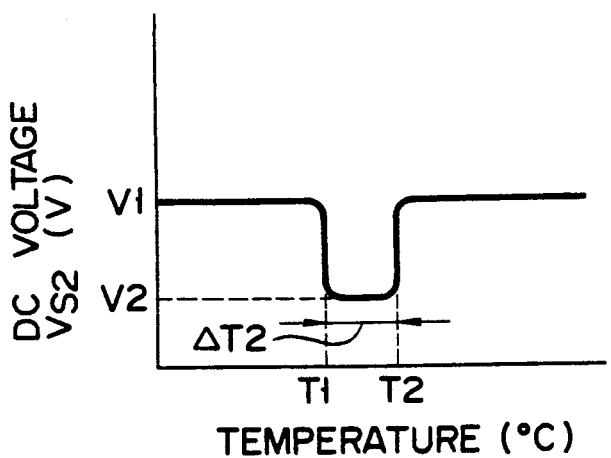
FIG. 8 is a graph showing temperature dependency of a second compensation voltage Vs2.

As shown in FIG. 8, therefore, the second compensation voltage Vs2 at the output terminal b is kept to be a voltage V2 in the specific temperature region ΔT2 defined by temperatures T1 to T2, and kept to be a constant voltage V1 at other temperatures. Therefore, a lower limit temperature T1 in the specific temperature region ΔT2 is determined in accordance with a ratio of the resistances of the thermistor RT1 and the resistor R4, and an upper limit temperature T2 is determined in accordance with a ratio of the resistances of the thermistor RT2 and the resistor R5. A specific voltage V2 determined based on a frequency correction amount is determined in accordance with a ratio of the resistors R2 and R3. Therefore, when the upper and lower limit temperatures T1 and T2 in the specific temperature region ΔT2, and the specific voltage V2 are determined, the resistances R3, R4, and R5 are inevitably determined.

Figure 3:
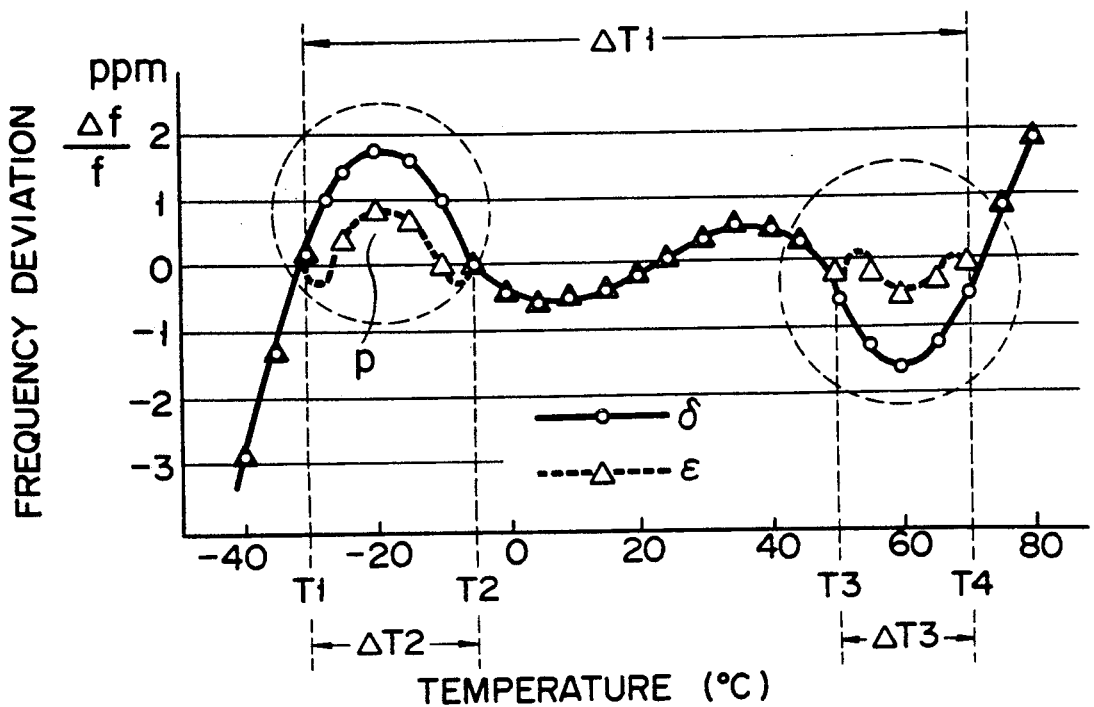
FIG. 3 is a graph showing a curve $\delta$ obtained by enlarging a curve $\gamma$ in FIG. 2, and a curve $\epsilon$ representing compensated frequency deviations obtained by the present invention.

The temperature-compensated quartz crystal oscillator with the above arrangement causes the first temperature compensating unit 11 to compensate the frequency-temperature characteristics of the oscillating circuit 1 represented by a cubic curve in a rated temperature range ΔT1 in FIG. 3. As a result, first compensation temperature characteristics represented by the curve δ in FIG. 3 can be obtained in the temperature range defined by temperatures of −30° C. to 70° C. In the first compensation temperature characteristics, a frequency deviation Δf/f exceeds ±1 ppm near −20° C. and 60° C., and falls within ±1 ppm at other temperatures.

The second temperature compensating unit 12 compensates the first compensation temperature characteristics in a temperature region near −20° C. in which the frequency deviation exceeds the rated value of +1 ppm, and keeps the frequency deviation to be 1 ppm or less in this temperature range. This function will be described below.

The upper and lower limit temperatures T1 and T2 defining the specific temperature region ΔT2, and the specific voltage V2 are determined on the basis of the first compensation temperature characteristics. Since the first compensation temperature characteristics near −20° C. are represented by an inverted U-shaped curve having a maximum value of 1.8 ppm, the frequency deviation exceeds the upper limit of the rated range by 0.8 ppm. Therefore, in order to cause the frequency deviation to fall within ±1 ppm, a correction amount of the frequency is set to be −1 ppm. The specific voltage V2 to be applied to the varactor 16 is determined as shown in FIG. 8 in correspondence with the frequency correction amount. As represented by voltage-temperature characteristics in FIG. 8, the voltage-temperature characteristics form curves near the upper and lower limit temperatures T1 and T2. Such characteristics are obtained by operation characteristics of the transistors Tr1 and Tr2. Then, the upper limit temperature T2 of the specific temperature region ΔT2 is set to be, e.g., −5° C. at which the frequency deviation is "0", and the lower limit temperature T1 is set to be −30° C. at which the frequency deviation is "0".

Figure 9:
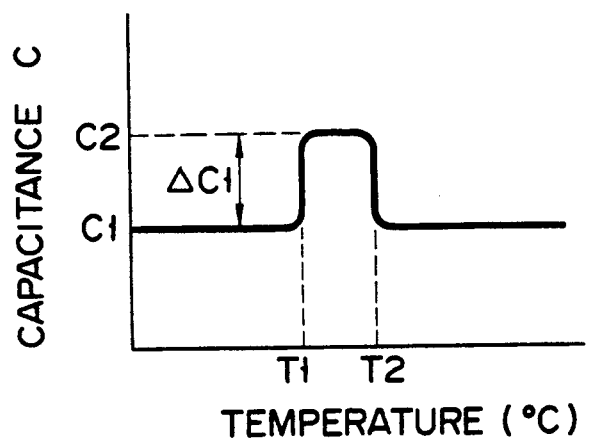
FIG. 9 is a graph showing capacitance-temperature characteristics of a varactor.
Figure 10:
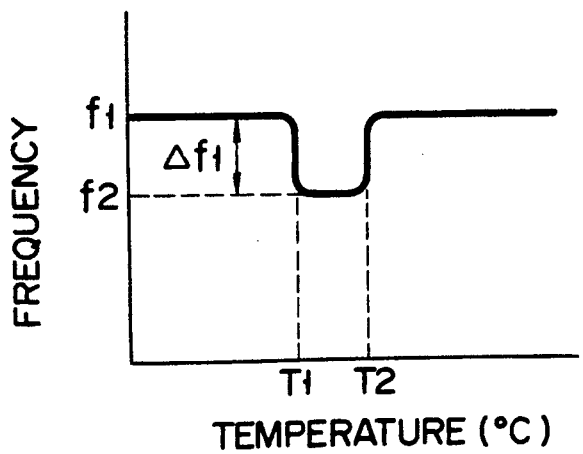
FIG. 10 is a graph showing a change in oscillation frequency of an oscillating circuit corresponding to a change in temperature.

When the temperatures are set as described above, the specific voltage V2 is applied to the second varactor 16 in the specific temperature region ΔT2. Since the specific voltage V2 is cut off by the coupling capacitor 17 in a DC manner, the specific voltage V2 is not applied to the first varactor 14. Therefore, only a change ΔC1 in capacitance of the second varactor 16 shown in FIG. 9 affects the first compensation temperature characteristics. Along with the change ΔC1 in capacitance, the oscillation frequency is changed from f1 to f2. This change is Δf1, as shown in FIG. 10. The change in oscillation frequency causes a change in frequency deviation Δf/f near −20° C. by only −1 ppm. As a result, the frequency deviation Δf/f is decreased from 1.8 ppm to 0.8 ppm. An absolute change in frequency deviation near −20° C. is maximum, i.e., −1 ppm, and an amount of change in frequency deviation around −20° C. is gradually decreased in accordance with an applied voltage. As a result, as represented by a curve ε in FIG. 3, the frequency deviation in the specific temperature region ΔT2 represents a substantially inverted U-shaped curve having a maximum value at −20° C. As is apparent from the curve ε, the frequency deviation is 1 ppm or less.

Since a normal voltage V1 is applied to the second varactor 16 outside the specific temperature region ΔT2, the compensation temperature characteristics change. Therefore, by adjusting the coupling capacitor 17, an oscillation frequency at, e.g., normal temperature of 25° C. must be set to be an oscillation frequency which is the same as that when only the first temperature compensating unit 11 is used.

The temperature-compensated quartz crystal oscillator of the first embodiment causes the second temperature compensating unit 12 to selectively compensate a frequency deviation near −20° C. which exceeds the upper limit of the rated range in the first compensation temperature characteristics, and a frequency deviation of 1 ppm or less can be obtained. Therefore, if the rated range of the frequency deviation in a temperature range defined by temperatures, e.g., −30° C. to 50° C. is within ±1 ppm, the temperature-compensated quartz crystal oscillator of the first embodiment satisfies the above ratings. According to this embodiment, since another first temperature compensating unit 11 need not be manufactured for replacement as in the conventional case, a production yield of the temperature-compensated quartz crystal oscillator is improved, thus improving productivity.

Figure 11:
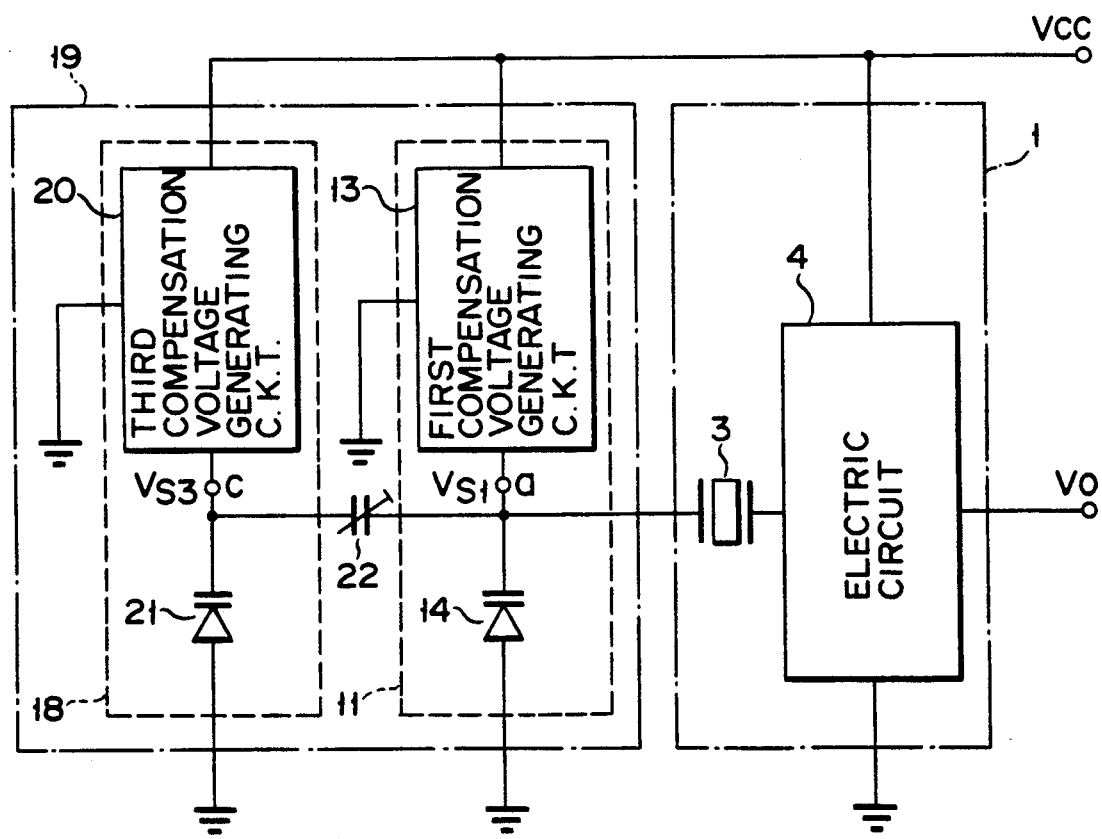
FIG. 11 is a block diagram of a temperature-compensated quartz crystal oscillator according to a second embodiment of the present invention.

A second embodiment of the present invention will be described hereinafter with reference to FIG. 11. The same reference numerals in this embodiment denote the same parts as in the first embodiment, and a detailed description thereof will be omitted. In this embodiment, when a frequency deviation of the first compensation temperature characteristics falls outside the rated range in the negative direction, it is compensated by a third temperature compensating unit 18.

A temperature compensator 19 includes a first temperature compensating unit 11 and a third temperature compensating unit 18. The first temperature compensating unit 11 compensates frequency-temperature characteristics of an oscillating circuit 1 within a rated temperature range ΔT1 in the same manner as in the first embodiment so as to provide first compensation temperature characteristics represented by a curve δ in FIG. 3.

The third temperature compensating unit 18 includes a third compensation voltage generating circuit 20 and a varactor 21 connected to an output terminal c of the third compensation voltage generating circuit 20. One terminal of the third compensation voltage generating circuit 20 is connected to a power source $V_{CC}$, and the other terminal thereof is grounded. A third compensation voltage Vs3 corresponding to a temperature in the rated temperature range is output from the output terminal c of the third compensation voltage generating circuit 20. As shown in FIG. 14, the third compensation voltage Vs3 is kept at a normal voltage V3 having a constant value outside a specific temperature region ΔT3. The third compensation voltage Vs3 is kept at a specific voltage V4 higher than the normal voltage V3 within the specific temperature region ΔT3.

Figure 12:
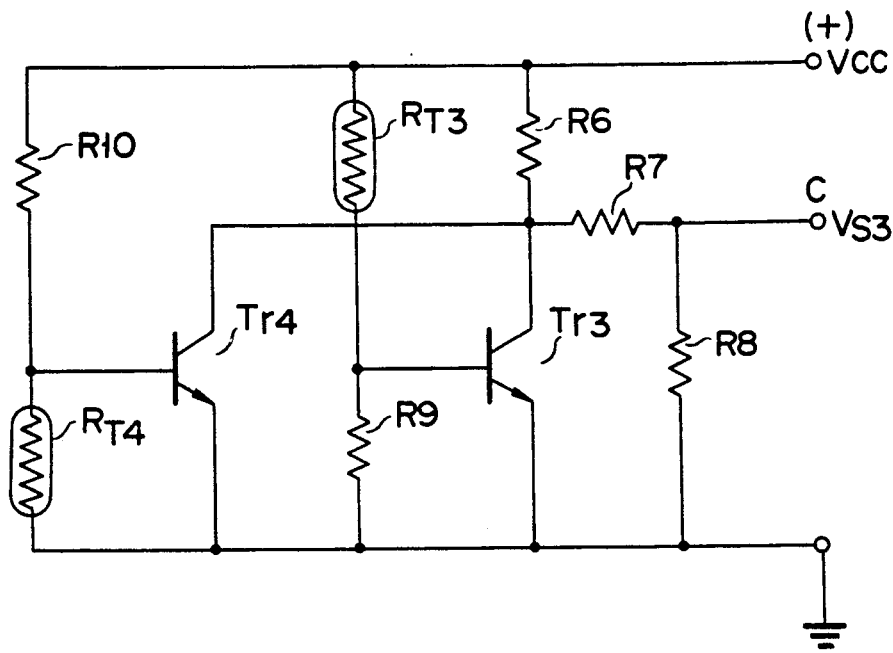
FIG. 12 is a circuit diagram showing an arrangement of a third compensation voltage generating circuit.

FIG. 12 shows an arrangement of the third compensation voltage generating circuit 20. The collectors of transistors Tr3 and Tr4 are connected to the power source $V_{CC}$ through a load resistor R6. The emitters of the transistors Tr3 and Tr4 are grounded. Series-connected resistors R7 and R8 are arranged between the collector and the emitter of the transistor Tr3. A node between the resistors R7 and R8 is connected to the output terminal c for outputting the compensation voltage Vs3. A thermistor RT3 and a resistor R9 are connected between the power source $V_{CC}$ and a ground potential. A node between the thermistor RT3 and the resistor R9 is connected to the base of the transistor Tr3. In addition, a resistor R10 and a thermistor RT4 n are connected between the power source $V_{CC}$ and the ground potential. A node between the resistor R10 and the thermistor RT4 is connected to the base of the transistor Tr4.

Figure 13A:
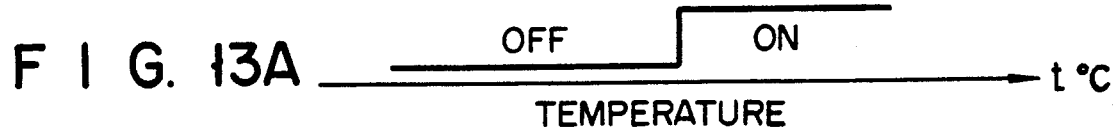
FIGS. 13A to 13C are graphs showing switching characteristics of transistors Tr3 and Tr4 which are shown in FIG. 5 and those of a transistor circuit constituted by the tansistors Tr3 and Tr4.
Figure 13B:
Figure 13C:
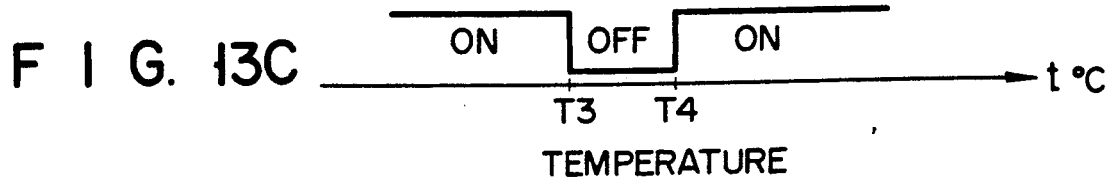

The thermistors RT3 and RT4 have resistance-temperature characteristics shown in FIG. 6. More specifically, the resistance of each thermistor is exponentially decreased along with an increase in temperature. As shown in FIG. 13A, the characteristics of the thermistor RT3 and the resistance of the resistor R9 are set to turn on the transistor Tr3 at a temperature T4. As shown in FIG. 13B, the characteristics of the thermistor RT4 and the resistance of the resistor R10 are set to turn off the transistor Tr4 at a temperature T3. Therefore, as shown in FIG. 13C, each of the transistors Tr3 and Tr4 performs a switching operation in which it is kept OFF within a range defined by temperatures T3 to T4, and is kept ON at other temperatures.

As shown in FIG. 14, therefore, the second compensation voltage Vs3 at the output terminal c is kept to be a voltage V4 in the specific temperature region ΔT3 defined by temperatures T3 to T4, and kept to be a constant voltage V3 at other temperatures. Therefore, a lower limit temperature T3 in the specific temperature region ΔT3 is determined in accordance with a ratio of resistances of the thermistor RT4 and the resistor R10, and an upper limit temperature T4 is determined in accordance with a ratio of resistances of the thermistor RT3 and the resistor R9. A specific voltage V4 determined based on a frequency correction amount is determined in accordance with a ratio of the resistors R7 and R8. Therefore, when the upper and lower limit temperatures T3 and T4 in the specific temperature region ΔT3, and the specific voltage V4 are determined, the resistances R8, R9, and R10 are necessarily determined.

The third temperature compensating unit 18 compensates the first compensation temperature characteristics in a range in which the frequency deviation negatively exceeds the rated value of −1 ppm near 60° C. to keep the frequency deviation in this range to be −1 ppm or more. This function will be described below.

The upper and lower limit temperatures T3 and T4 in the specific temperature region ΔT3, and the specific voltage V4 are determined on the basis of the first compensation temperature characteristics. Since the first compensation temperature characteristics near 60° C. are represented by a U-shaped curve having a minimum value of −1.8 ppm, the frequency deviation negatively exceeds the lower limit of the rated range by −0.8 ppm. Therefore, in order to cause the frequency deviation to fall within ±1 ppm, a correction amount of the frequency is set to be 1 ppm. The specific voltage V4 to be applied to the varactor 21 is determined as shown in FIG. 14 in correspondence with the frequency correction amount. Then, the upper limit temperature T4 in the specific temperature region ΔT3 is set to be, e.g., −5° C. at which the frequency deviation is −0.5 ppm, and the lower limit temperature T3 is set to be 50° C. at which the frequency deviation is −0.5 ppm.

When the temperatures are set as described above, the specific voltage V4 is applied to only the third varactor 21 in the specific temperature region ΔT3. Since the specific voltage V4 is cut off by the coupling capacitor 22 in a DC manner, the specific voltage V4 is not applied to the first varactor 14. Therefore, only a change ΔC2 in capacitance of the third varactor 21 shown in FIG. 15 affects the first compensation temperature characteristics. Along with the change ΔC2 in capacitance, the oscillation frequency is changed from f3 to f4. This change is Δf2, as shown in FIG. 16. The change in oscillation frequency causes a change in frequency deviation Δf/f near 60° C. by only 1 ppm. As a result, the frequency deviation Δf/f is decreased from −1.8 ppm from −0.8 ppm. An absolute change in frequency deviation near 60° C. is maximum, i.e., 1 ppm, and an amount of change in frequency deviation around 60° C. is gradually decreased in accordance with an applied voltage. As a result, as represented by a curve ε in FIG. 3, the frequency deviation in the specific temperature region ΔT3 represents a substantially U-shaped curve having a minimum value at 60° C. As is apparent from the curve ε, the frequency deviation is −1 ppm or more.

Also in this case, since a normal voltage V3 is applied to the third varactor 21 outside the specific temperature region ΔT3, the compensation temperature characteristics are changed. Therefore, by adjusting the coupling capacitor 22, the oscillation frequency need be set to be the same as the oscillation frequency obtained when only the first temperature compensating unit 11 is used.

The temperature-compensated quartz crystal oscillator of the second embodiment causes the third temperature compensating unit 18 to selectively compensate a frequency deviation near 60° C. which negatively exceeds the lower limit of the rated range in the first compensation temperature characteristics, and a frequency deviation within ±1 ppm can be obtained. Therefore, if the rated range of the frequency deviation in a temperature range defined by temperatures, e.g., −10° C. to 70° C. is within ±1 ppm, the temperature-compensated quartz crystal oscillator of the second embodiment satisfies the above ratings. According to this embodiment, since another first temperature compensating unit 11 need not be manufactured for replacement as in the conventional case, the production yield of the temperature-compensated quartz crystal oscillator is improved, thus improving productivity.

Figure 17:
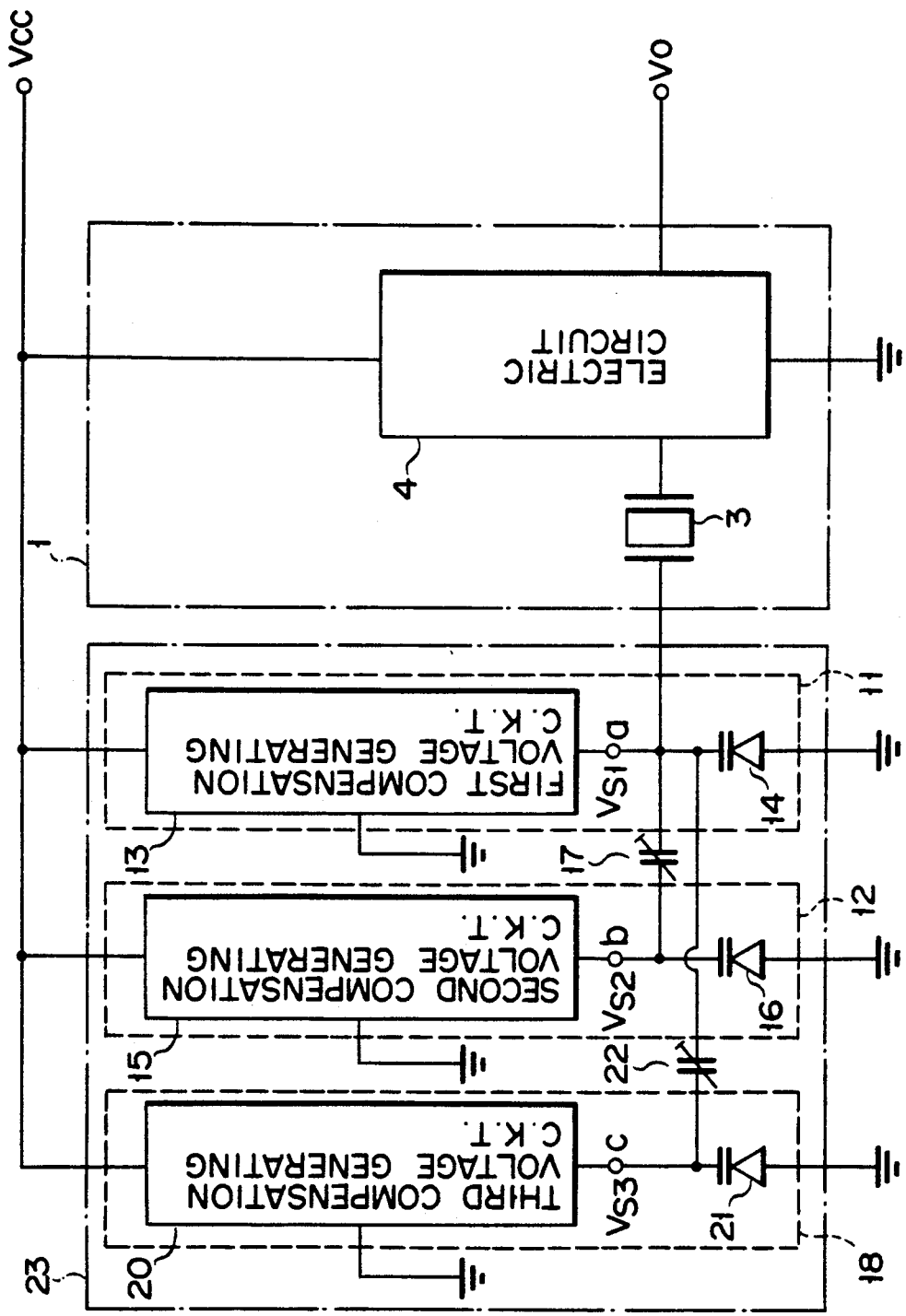
FIG. 17 is a block diagram of a temperature-compensated quartz crystal oscillator according to a third embodiment of the present invention.

A temperature-compensated quartz crystal oscillator according to a third embodiment of the present invention will be described hereinafter with reference to FIG. 17. This temperature-compensated quartz crystal oscillator includes a temperature compensator 23 having first and second temperature compensating units 11 and 12, as found in the first embodiment, and a third temperature compensating unit 18, as found in the second embodiment. An output voltage Vs2 output from a second compensation voltage generating circuit 15 is supplied to an output terminal a of a first compensation voltage generating circuit 13 through a coupling capacitor 17. An output voltage Vs3 output from a third compensation voltage generating circuit 20 is supplied to the output terminal a of the first compensation voltage generating circuit 13 through a coupling capacitor 22. Since other arrangements are the same as in the first and second embodiments, the same reference numerals in this embodiment denote the same parts as in the first and second embodiments, and a detailed description thereof will be omitted.

The temperature-compensated quartz crystal oscillator of this embodiment can compensate frequency deviations in both specific temperature regions ΔT2 and ΔT3 in FIG. 3. Therefore, frequency deviations can fall within ±1 ppm in a rated temperature range defined by temperatures −30° C. to 70° C.

According to the above embodiments, regardless of the shape of the first temperature compensation characteristic curve shown in FIG. 3, a frequency deviation which falls outside the rated range can be compensated. More specifically, when n (n=3, 4, ..., k) frequency deviations fall outside the rated range, n temperature compensating units and n coupling capacitors may be combined to constitute a temperature compensator.

A temperature region wherein a frequency deviation exceeds 1 ppm in practice can be set as a specific temperature region. In this case, the frequency deviation in the specific temperature region may be compensated to set the specific voltages V2 and V4 so that the frequency deviation falls within ±1 ppm.

Although the normal voltages V1 and V3 are set at a predetermined level in the first and second embodiments, the normal voltages V1 and V3 can be set at "0" level.

The first temperature compensating unit 11 can be constituted by a serial/parallel circuit including, e.g., a thermistor, a capacitor, and a resistor to obtain the first compensation temperature characteristics by using a so-called direct compensating method.

According to this embodiment, the following advantages can be obtained, additionally. In theory, the frequency-temperature characteristics of the quartz crystal vibrator 3 are represented by a cubic curve having an inflection point near normal temperature of 25° C. In practice, however, even if the quartz crystal vibrator is designed to obtain the theoretical frequency-temperature characteristics, the frequency-temperature characteristics are distorted due to sub-vibration of the quartz crystal vibrator or a very small shift of a cutting angle. Such distortion causes production of a defective quartz crystal vibrator which cannot be used for the temperature-compensated quartz crystal oscillator. However, by applying this embodiment, even if a quartz crystal vibrator having frequency-temperature characteristics which slightly deviate from theoretical values is used, its frequency-temperature characteristics can be partially compensated. Therefore, the quartz crystal vibrator can be used as a quartz crystal vibrator for the temperature-compensated quartz crystal oscillator.

A temperature-compensated quartz crystal oscillator according to a fourth embodiment of the present invention will be described hereinafter with reference to FIG. 18. In this embodiment, of first compensation temperature characteristics represented by a curve δ in FIG. 3, a frequency deviation in a specific temperature region ΔT2 in which the frequency deviation falls outside the rated range in the positive direction is further compensated.

A multi-electrode type quartz crystal vibrator 130 is used in the temperature-compensated quartz crystal oscillator. The quartz crystal vibrator 130 includes an AT cut quartz crystal piece 103, and a first pair of electrodes 131 and 132 and a second pair of electrodes 133 and 134 which are arranged on the quartz crystal piece 103. The electrode 131 of the first pair is connected to an electric circuit 104, and the electrode 132 is connected to a first temperature compensating unit 111. The electrode 133 of the second pair is grounded through a capacitor 141 for frequency adjustment, and the electrode 134 is connected to a second temperature compensating unit 112. The electric circuit 104 has the same arrangement as that of the electric circuit 4 in the first embodiment.

The first temperature compensating unit 111 corresponds to the first temperature compensating unit 11 in the first embodiment, and includes a first compensation voltage generating circuit 113 and a first varactor 114. The first compensation voltage generating circuit 113 outputs a first compensation voltage Vs1 corresponding to ambient temperature in the rated temperature range at an output terminal a. The first compensation voltage Vs1 is supplied to the electrode 132.

The second temperature compensating unit 112 includes a second compensation voltage generating circuit 115 and a second varactor 116. The second temperature compensating unit 112 corresponds to the second temperature compensating unit 12 in the first embodiment, and the second compensation voltage generating circuit 115 corresponds to the second compensation voltage generating circuit 15. A second compensation voltage Vs2 corresponding to a temperature in the rated temperature range is output from an output terminal b of the second compensation voltage generating circuit 115, and the second compensation voltage Vs2 is supplied to the electrode 134. An arrangement of the second compensation voltage generating circuit 115 is the same as that in FIG. 5.

The second compensation voltage Vs2 has characteristics shown in FIG. 8. The cathode of the second varactor 116 is connected to the output terminal b of the second compensation voltage generating circuit 115, and the anode thereof is grounded. When the second compensation voltage Vs2 is supplied to the cathode of the second varactor 116, a capacitance of the second varactor 116 is changed by only ΔC1 in accordance with the second compensation voltage Vs2, as shown in FIG. 9. This change in capacitance affects the oscillating circuit 104 through elastic coupling of the two pairs of electrodes, and the oscillation frequency of the oscillating circuit 104 is changed by only Δf1, as shown in FIG. 10.

According to the temperature-compensated quartz crystal oscillator of the fourth embodiment, a frequency deviation in the specific temperature region ΔT2 shown in FIG. 3 can be compensated to fall within the desired frequency deviation limits for the rated range of ±1 ppm, in the same manner as in the temperature-compensated quartz crystal oscillator of the first embodiment. More specifically, in the specific temperature region ΔT2, the frequency-temperature characteristics represented by a curve ε can be obtained.

According to the temperature-compensated quartz crystal oscillator of this embodiment, the same advantages as those of the temperature-compensated quartz crystal oscillator of the first embodiment can be obtained. In addition, according to this embodiment, since the first temperature compensating unit 111 is connected to the electrode 132 and the second temperature compensating unit 112 is connected to the electrode 134, the first and second temperature compensating units 111 and 112 can be electrically disconnected from each other. Therefore, an electrical influence between the first and second temperature compensating units 111 and 112 can be reduced, and hence the temperature-compensated quartz crystal oscillator in this embodiment can independently compensate frequency-temperature characteristics. As a result, the temperature-compensated quartz crystal oscillator in this embodiment can be easily designed.

A temperature-compensated quartz crystal oscillator according to a fifth embodiment of the present invention will be described hereinafter with reference to FIG. 19. The same reference numerals in FIG. 19 denote the same parts as in the fourth embodiment in FIG. 18, and a detailed description thereof will be omitted. In this embodiment, of first compensation temperature characteristics represented by a curve δ in FIG. 3, a frequency deviation in a specific temperature region ΔT3 in which the frequency deviation falls outside the rated range in the negative direction is further compensated by a third temperature compensating unit 118.

In this embodiment, an electrode 131 of a first pair of electrodes of a quartz crystal vibrator 130 is connected to an electric circuit 104, and an electrode 132 is connected to a first temperature compensating unit 111. The first temperature compensating unit 111 compensates the frequency-temperature characteristics of an oscillating circuit 101 in a rated temperature range T1, and first compensation temperature characteristics represented by the curve δ in FIG. 3 are obtained.

An output from a third temperature compensating unit 118 is supplied to an electrode 136 of a second pair of electrodes. An electrode 135 of the second pair is grounded through a capacitor 142 for frequency adjustment. The third temperature compensating unit 118 includes a third compensation voltage generating circuit 120 and a varactor 121 connected to an output terminal c of the third compensation voltage generating circuit 120. The third temperature compensating unit 118 corresponds to the third temperature compensating unit 18 in the second embodiment, and the third compensation voltage generating circuit 120 corresponds to the third compensation voltage generating circuit 20. A third compensation voltage Vs3 corresponding to a temperature in the rated temperature range is output from the output terminal c of the third compensation voltage generating circuit 120, and the third compensation voltage Vs3 is supplied to the electrode 136. An arrangement of the third compensation voltage generating circuit 120 is the same as an arrangement shown in FIG. 12.

The third compensation voltage Vs3 has characteristics shown in FIG. 14. The cathode of the third varactor 121 is connected to the output terminal c of the third compensation voltage generating circuit 120, and the anode thereof is grounded. When the third compensation voltage Vs3 is supplied to the cathode of the third varactor 121, the capacitance of the third varactor 121 is changed by only ΔC2 in accordance with the third compensation voltage Vs3, as shown in FIG. 15. This change in capacitance affects the oscillating circuit 104 through elastic coupling of the two pairs of electrodes, and the oscillation frequency of the oscillating circuit 104 is changed by only Δf2, as shown in FIG. 16.

According to the temperature-compensated quartz crystal oscillator in the fifth embodiment, a frequency deviation in the specific temperature region ΔT3 in FIG. 3 can be compensated to fall within the desired frequency deviation limits for the rated range of ±1 ppm, in the same manner as in the temperature-compensated quartz crystal oscillator of the second embodiment. More specifically, in the specific temperature region ΔT3, the frequency-temperature characteristics represented by a curve ε can be obtained.

According to the temperature-compensated quartz crystal oscillator of this embodiment, the same advantages as those of the temperature-compensated quartz crystal oscillators in the second and fourth embodiments can be obtained.

Figure 20:
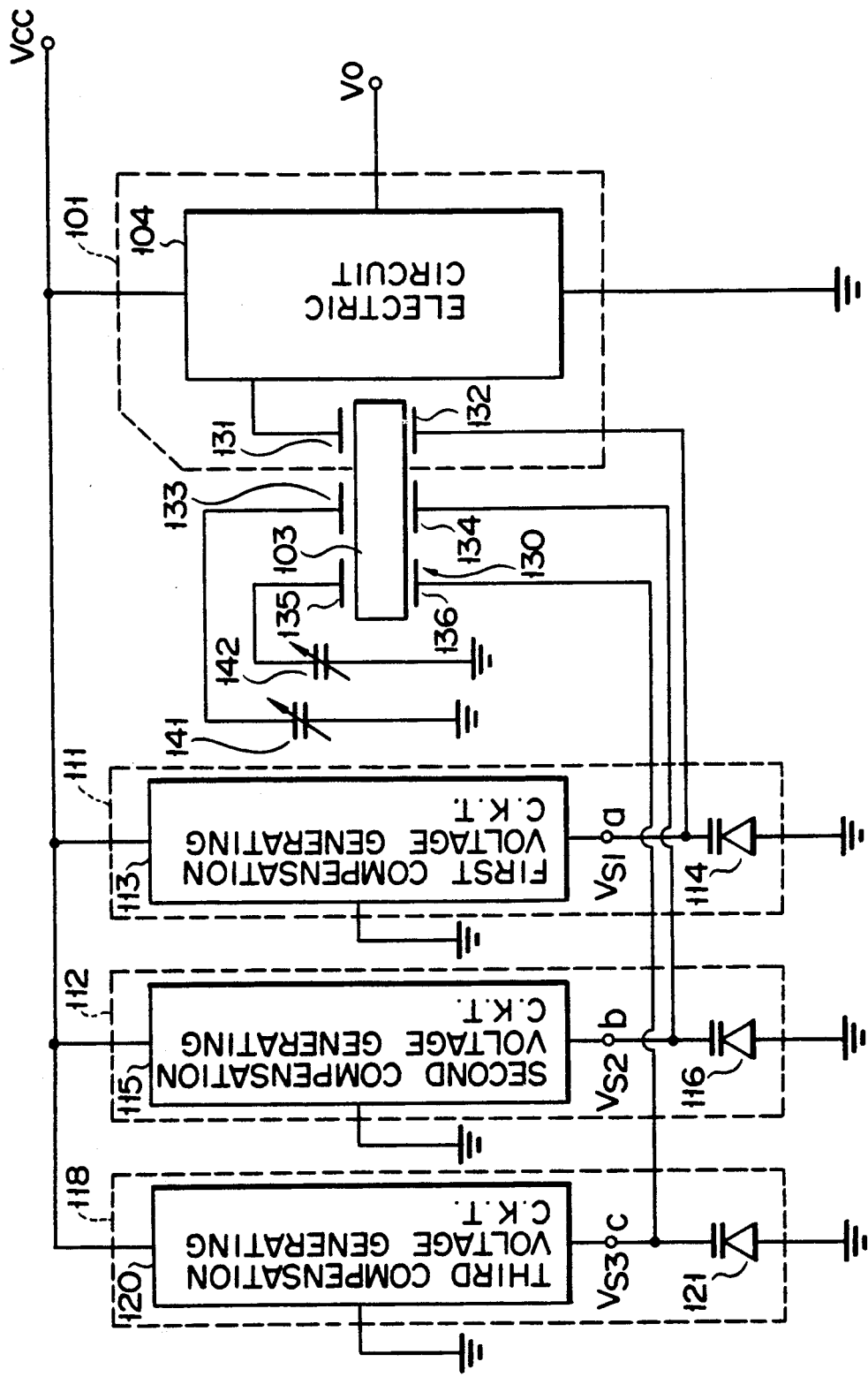
FIG. 20 is a block diagram of a temperature-compensated quartz crystal oscillator according to a sixth embodiment of the present invention.

A temperature-compensated quartz crystal oscillator according to a sixth embodiment of the present invention will be described hereinafter with reference to FIG. 20. The temperature-compensated quartz crystal oscillator includes first and second compensating units 111 and 112, as found in the fourth embodiment, and a third temperature compensating unit 118, as found in the fifth embodiment. Three pairs of electrodes are arranged in a quartz crystal vibrator 103. An output voltage Vs2 from a second compensation voltage generating circuit 115 is supplied to an electrode 134 of a second pair of electrodes. An output voltage Vs3 output from a third compensation voltage generating circuit 120 is supplied to an electrode 136 of a third pair of electrodes. Since other arrangements are the same as those in the fourth and fifth embodiments, the same reference numerals in this embodiment denote the same parts as in the fourth and fifth embodiments, and a detailed description thereof will be omitted.

According to the temperature-compensated quartz crystal oscillator of this embodiment, frequency deviations in both specific temperature regions ΔT2 and ΔT3 in FIG. 3 can be compensated. Therefore, the frequency deviation in the rated temperature range defined by temperatures −30° C. to 70° C. can fall within ±1 ppm.

In the sixth embodiment, when three or more, i.e., specific temperature regions in which the frequency deviation falls outside the rated range are present, (n+1) pairs of electrodes are arranged on the quartz crystal vibrator. The (n+1) temperature compensating units are connected to the electrodes, respectively.

In the above fourth to sixth embodiments, a particular arrangement of the electrodes on the quartz crystal vibrator is not preferred. However, in consideration of the vibration characteristics of the quartz crystal vibrator, the pair of electrodes connected to the electric circuit 104 are preferably formed in the central portion of the quartz crystal piece.

The basic temperature-compensated quartz crystal oscillator having a multi-electrode structure is disclosed in Japanese Patent Application Nos. 63-15142 and 63-25093 by the present applicant. These disclosures may be referred, as needed.

Another arrangement of the second compensation voltage generating circuits 15 and 115 will be described hereinafter with reference to FIG. 21. The same reference numerals in FIG. 21 denote the same parts as in the embodiment shown in FIG. 5, and a detailed description thereof will be omitted. In this arrangement, a buffer resistor R11 is arranged between the base of the transistor Tr1 and a thermistor RT1, and a buffer resistor R12 is arranged between the base of the transistor Tr2 and a thermistor RT2. Thus, by arranging the buffer resistors R11 and R12, the rising and falling characteristics of the compensation voltage Vs2 can be kept moderate. In other words, slow switching characteristics of the transistors Tr1 and Tr2 are obtained. As a result, as shown in FIG. 22, sine or cosine voltage-temperature characteristics can be obtained. On the basis of the voltage-temperature characteristics, a capacitance C of the varactor is slowly changed from C1 to C2, as shown in FIG. 23. An oscillation frequency is also slowly changed from f1 to f2, as shown in FIG. 24.

In this arrangement, since an abrupt change in frequency at temperatures T1, T2, T3, and T4 can be prevented, noise that would be produced by an abrupt change in frequency can be prevented.

Figure 26:
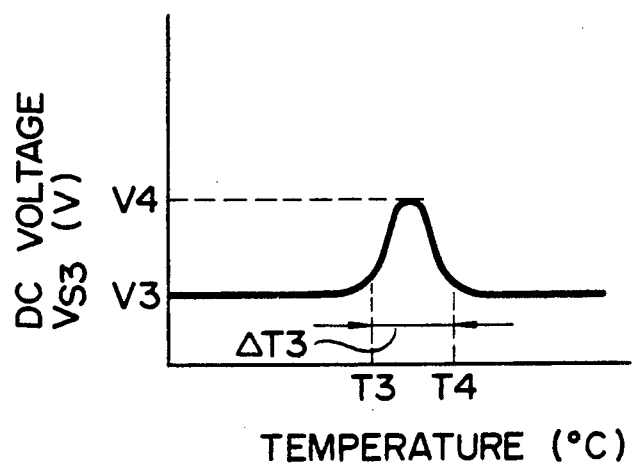
FIG. 26 is a graph showing temperature dependency of a third compensation voltage Vs3 in FIG. 25.
Figure 27:
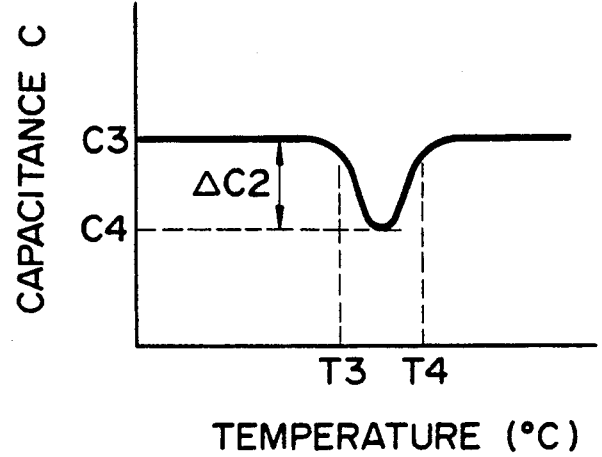
FIG. 27 is a graph showing capacitance-temperature characteristics of the varactor in accordance with the third compensation voltage Vs3 in FIG. 25.
Figure 28:
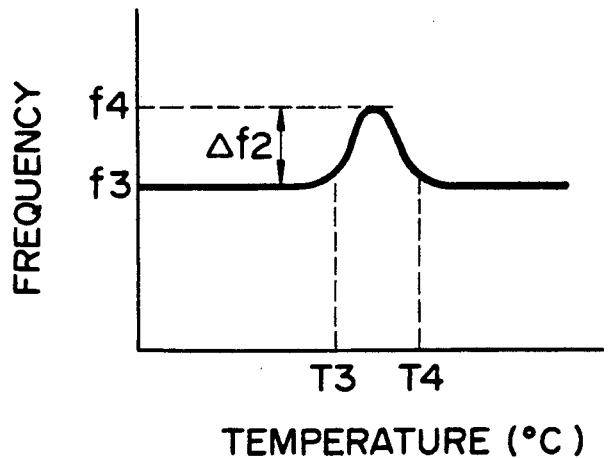
FIG. 28 is a graph showing a change in oscillation frequency of the oscillating circuit corresponding to a change in temperature in accordance with the third compensation voltage Vs3 in FIG. 25.

Another arrangement of the third compensation voltage generating circuits 20 and 120 will be described hereinafter with reference to FIG. 25. The same reference numerals in FIG. 25 denote the same parts as in the embodiment shown in FIG. 12, and a detailed description thereof will be omitted. In this arrangement, a buffer resistor R13 is arranged between the base of the transistor Tr3 and a thermistor RT3, and a buffer resistor R14 is arranged between the base of the transistor Tr4 and a thermistor RT4. Thus, by arranging the buffer resistors R13 and R14, the rising and falling characteristics of the compensation voltage Vs3 can be kept moderate. In other words, slow switching characteristics of the transistors Tr3 and Tr4 are obtained. As a result, as shown in FIG. 26, sine or cosine voltage-temperature characteristics can be obtained. On the basis of the voltage-temperature characteristics, a capacitance C of the varactor is slowly changed from C3 to C4, as shown in FIG. 27. An oscillation frequency is also slowly changed from f3 to f4, as shown in FIG. 28.

In this arrangement, since an abrupt change in frequency at temperatures T1, T2, T3, and T4 can be prevented, noise that would be produced by an abrupt change in frequency can be prevented, as in the embodiment shown in FIG. 21.

As is apparent from the above description, each of the compensation voltage generating circuits shown in FIGS. 5, 12, 21, and 25 generates a specific voltage in a specific temperature region. When a varactor is connected to the output terminal of each compensation voltage generating circuit and the second and third temperature compensation units are formed as in the above embodiments, each of the second and third temperature compensating units can be used as a temperature compensating element wherein a capacitance of a varactor is changed in only a specific temperature region.

The above temperature compensating element can be used as a sensor for detecting a temperature in the specific temperature region.

In the compensation voltage generating circuits shown in FIGS. 5 and 21, even if the resistors R4 and R5 are replaced by posistors and the thermistors RT1 and RT2 are replaced by resistors, the same function as those of the compensation voltage generating circuits in FIGS. 5 and 21 can be achieved. In the compensation voltage generating circuits shown in FIGS. 12 and 25, the resistors R9 and R10 can be replaced by posistors, and the thermistors RT3 and RT4 can be replaced by resistors.

What is claimed is:

1. A temperature-compensated crystal oscillator, for providing a signal oscillating at a predetermined frequency, said crystal oscillator having frequency-temperature characteristics depending upon temperature, the frequency of the signal provided by said oscillator being determined by said frequency-temperature characteristics, said oscillator comprising:
   oscillating circuit means for providing an oscillating signal, said oscillating circuit means having a quartz crystal vibrator as an oscillating element, said oscillating circuit means having a rated temperature range and given frequency-temperature characteristics; and
   temperature compensating means coupled to said quartz crystal vibrator for compensating the frequency-temperature characteristics of said oscillating circuit means, said temperature compensating means including:
   first temperature compensating means for compensating the frequency-temperature characteristics of the oscillating circuit means within a rated temperature range of said oscillating circuit means to obtain compensated frequency-temperature characteristics; and
   second temperature compensating means for further compensating said compensated frequency-temperature characteristics in a specific temperature region of said compensated frequency-temperature characteristics, said specific temperature region being within said rated temperature range and extending over only a part of said rated temperature range, to obtain desired frequency-temperature characteristics for the crystal oscillator.

2. A temperature-compensated crystal oscillator according to claim 1, wherein said first temperature compensating means includes:
   a first compensation voltage generating circuit for generating a first compensation voltage corresponding to temperatures in the rated temperature range of said oscillating circuit means; and
   a first voltage variable capacitance element, connected to said quartz crystal vibrator and to said first compensation voltage generating circuit, said first element being responsive to said first compensation voltage for changing a capacitance value thereof.

3. A temperature-compensated crystal oscillator according to claim 2, wherein said second temperature compensating means includes:
   a second compensation voltage generating circuit for generating a second compensation voltage corresponding to temperatures in said specific temperature region; and
   a second voltage variable capacitance element, connected to said second compensation voltage, said second voltage variable capacitance element being responsive to said second compensation voltage for changing a capacitance value thereof.

4. A temperature-compensated crystal oscillator according to claim 3, wherein said second compensation voltage generating circuit includes:
   first temperature sensing means, having a first resistance which changes values in response to a first temperature, for setting a first biasing voltage on the basis of the first resistance;
   first switching means for receiving the first biasing voltage to switch from an OFF state to an ON state at the first temperature;
   second temperature sensing means, having a second resistance which changes in value in response to a second temperature, for setting a second biasing voltage on the basis of the second resistance;
   second switching means for receiving the second biasing voltage to switch from an ON state to an OFF state at the second temperature; and
   means for coupling said first and second switching means to perform a switching operation in a region defined by the first and second temperatures so as to generate a voltage corresponding to temperatures in the region.

5. A temperature-compensated crystal oscillator according to claim 2, wherein said second temperature compensating means includes:
   a second compensation voltage generating circuit for generating a second compensation voltage corresponding to temperatures in the specific temperature region; and
   a second voltage variable capacitance element, connected to said second compensation voltage generating circuit and said quartz crystal vibrator while being cut off from said first voltage variable capacitance element in a DC manner, said second element being responsive to said second compensation voltage for changing a capacitance value thereof.

6. A temperature-compensated crystal oscillator according to claim 5, wherein said quartz crystal vibrator has first and second electrodes, said first electrode being connected to an electric circuit in said oscillating circuit means, and said second electrode being coupled to said first and second voltage variable capacitance elements.

7. A temperature-compensated crystal oscillator according to claim 5, wherein said second compensation voltage generating circuit includes:
   first temperature sensing means, having a first resistance which changes in value in response to a first temperature, for setting a first biasing voltage on the basis of the first resistance;
   first switching means for receiving the first biasing voltage to switch from an OFF state to an ON state at the first temperature;
   second temperature sensing means, having a second resistance which changes in response to a second temperature, for setting a second biasing voltage on the basis of the second resistance;

second switching means for receiving the second biasing voltage to switch from an ON state to an OFF state at the second temperature; and means for coupling said first and second switching means to perform a switching operation in a region defined by the first and second temperatures so as to generate a voltage corresponding to temperatures in the region.

8. A temperature-compensated crystal oscillator according to claim 1, wherein said quartz crystal vibrator has first and second electrodes, said first electrode being connected to an electric circuit in said oscillating circuit means, and said second electrode being connected to said first and second temperature compensating means.

9. A temperature-compensated crystal oscillator according to claim 1, wherein said quartz crystal vibrator includes at least first and second pairs of electrodes, said first pair of electrodes having first and second electrodes, and said second pair of electrodes having third and fourth electrodes, so that said first electrode is connected to an electric circuit in said oscillating circuit means, and said second electrode is connected to said first temperature compensating means, and said third electrode is grounded through a capacitor and said fourth electrode is connected to said second temperature compensating means.

10. A temperature-compensated crystal oscillator according to claim 9, wherein said first temperature compensating means includes:

a first compensation voltage generating circuit for generating a first compensation voltage corresponding to temperatures in the rated temperature range of said oscillating circuit means; and a first voltage variable capacitance element, connected to said quartz crystal vibrator and to said first compensation voltage generating circuit, said first element being responsive to said first compensation voltage for changing a capacitance value thereof.

11. A temperature-compensated crystal oscillator according to claim 10, wherein said second temperature compensating means includes:

a second compensation voltage generating circuit for generating a second compensation voltage corresponding to temperatures in the specific temperature region; and a second voltage variable capacitance element, connected to said quartz crystal vibrator and to said second compensation voltage generating circuit, said second element being responsive to said second compensation voltage for changing a capacitance value thereof.

12. A temperature-compensated crystal oscillator according to claim 1, wherein said second temperature compensating means includes:

first temperature sensing means, having a first resistance which changes in value in response to a first temperature, for setting a first biasing voltage on the basis of the first resistance;

first switching means for receiving the first biasing voltage to switch from an OFF state to an ON state at the first temperature;

second temperature sensing means, having a second resistance which changes in value in response to a second temperature, for setting a second biasing voltage on the basis of the second resistance;

second switching means for receiving the second biasing voltage to switch from an ON state to an OFF state at the second temperature;

means for coupling said first and second switching means and for causing said first and second switching means to perform a switching operating in a region defined by the first and second temperatures so as to generate a voltage corresponding to temperatures in the region; and voltage variable capacitance means responsive to said voltage corresponding to said temperature to change a capacitance value thereof in accordance with said corresponding voltage.

* * * * *